United States Patent [19]
Takamine et al.

[11] Patent Number: 4,994,771
[45] Date of Patent: Feb. 19, 1991

[54] MICRO-CONNECTOR TO MICROSTRIP CONTROLLED IMPEDANCE INTERCONNECTION ASSEMBLY

[75] Inventors: Henry K. Takamine; Allan E. Lange, both of Gardena, Calif.

[73] Assignee: Hughes Aircraft Company, Los Angeles, Calif.

[21] Appl. No.: 372,803

[22] Filed: Jun. 28, 1989

[51] Int. Cl.⁵ .............................................. H01P 5/08
[52] U.S. Cl. ...................................... 333/33; 333/246; 333/260
[58] Field of Search .......................... 333/33, 260, 246

[56] References Cited

U.S. PATENT DOCUMENTS

| | | | |
|---|---|---|---|
| 2,794,174 | 5/1957 | Arditi et al. | 333/33 |
| 3,201,722 | 8/1965 | May et al. | 333/33 |
| 3,245,013 | 4/1966 | Forge | 333/33 |
| 3,596,138 | 7/1971 | Lehrfeld | 333/33 |
| 3,967,223 | 6/1976 | McAvoy | 333/219 |
| 4,184,133 | 1/1980 | Gehle | 333/238 |
| 4,346,355 | 8/1982 | Tsukii | 333/33 |
| 4,494,083 | 1/1985 | Josefsson et al. | 333/33 |
| 4,593,243 | 6/1986 | Lao et al. | 324/158 P |
| 4,672,312 | 6/1987 | Takamine et al. | 324/158 F |
| 4,679,249 | 7/1987 | Tanaka et al. | 333/33 X |
| 4,825,155 | 4/1989 | Takamine | 324/158 F |
| 4,837,524 | 6/1989 | Nakamura | 333/33 X |
| 4,837,529 | 6/1989 | Gawronski et al. | 333/33 |

FOREIGN PATENT DOCUMENTS

| | | | |
|---|---|---|---|
| 1014183 | 8/1957 | Fed. Rep. of Germany | 333/246 |
| 91503 | 7/1981 | Japan | 333/33 |

OTHER PUBLICATIONS

Bland, G. F. et al.; "Coax to Stripline Transition"; *IBM Technical Disclosure Bulletin*; vol. 3, No. 4; Sep. 1960; pp. 22, 23.

Product Data Sheet (3 pages), dated Aug. 1984, entitled, "GaAs Digital IC Evaluation Kit HMK-11-MSI-1" of Harris Microwave Semiconductor; Milpitas, Calif.

"Pitfalls in Fabricating Microstrip Test Boards for High-Speed GaAs ICs", by Allan Lange and Henry Takamine, Journal of Monolithic Technologies, Jul. 1988, pp. 22-27.

*Primary Examiner*—Benny T. Lee
*Attorney, Agent, or Firm*—M. E. Lachman; W. K. Denson-Low

[57] ABSTRACT

A controlled impedance interconnection assembly (50), for connecting an x-band coaxial connector (66) to a microstrip (60) on a circuit board (52), comprises a circuit board having a core (54) of dielectric material terminated by first and second surfaces (56, 58). An electrically conductive microstrip (60) and electrically conductive material (62) are adhered respectively to the first and second surfaces, and a hole (64), substantially at right angles to the surfaces, extends through the core and the conductive material on the second surface, and to the conductive microstrip on the first surface. The x-band coaxial connector, including an inner conductor (68) and a conductive shell (70) coaxially surrounding the inner conductor, is secured at right angles to the circuit board. The conductive shell is electrically connected to the conductive material, and the inner conductor is extended through the hole and has a mechanically smooth, right-angled transition (74, 76) with and electrical connection to the conductive microstrip. The smooth, right-angled transition essentially eliminates otherwise high mismatches and VSWR (voltage standing wave ratio) in the connection and enables the circuit board to operate in excess of 14 GHz and in x-band frequencies with an augmented bandwidth. A tuning element (80) may be added to provide capacitive and inductive match for the microstrip, to focus the signal back into the microstrip, to provide a shielding from external or spurious signals and to minimize crosstalk between adjacent traces.

9 Claims, 2 Drawing Sheets

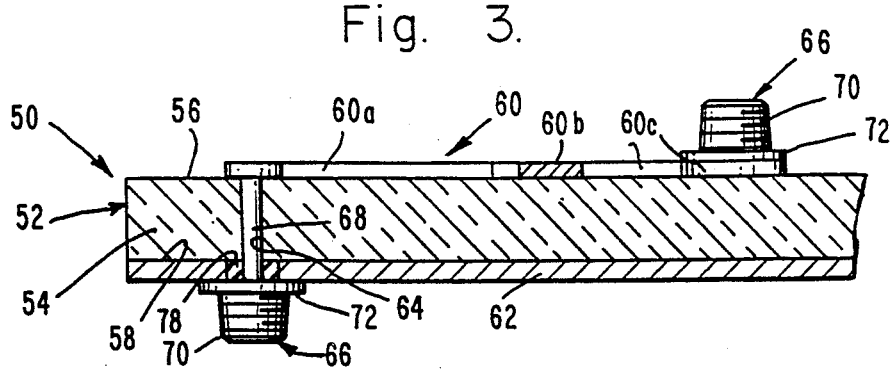
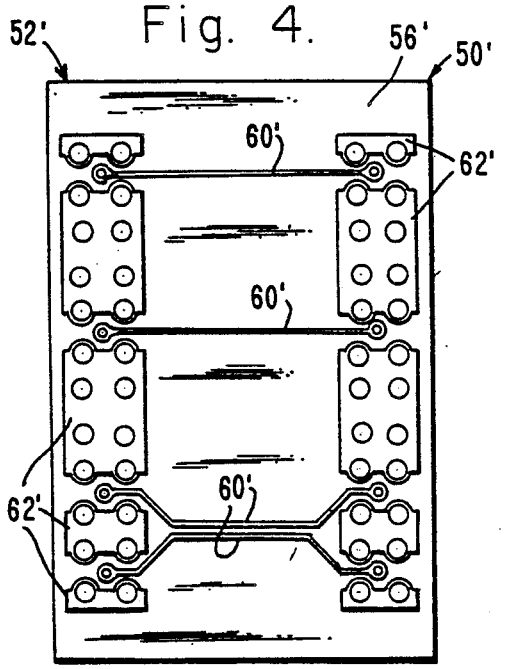
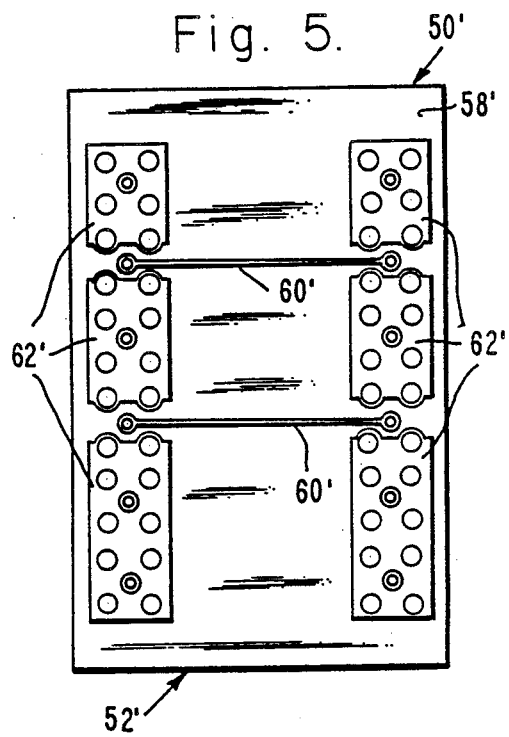
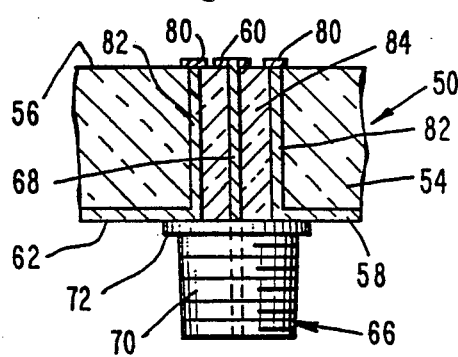
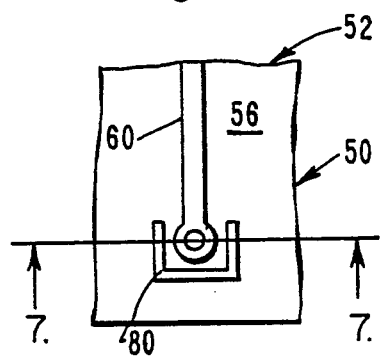

MICRO-CONNECTOR TO MICROSTRIP CONTROLLED IMPEDANCE INTERCONNECTION ASSEMBLY

BACKGROUND OF THE INVENTION

1. Field of the Invention

The present invention relates to interconnections between connectors and leads and, more particularly, to controlled impedance interconnections between microstrips and micro-connectors, specifically, x-band coaxial connectors, for reducing distortion in the transmission of electrical signals.

2. Description of Related Art and Other Considerations

Distortion caused by transmission pathways is proportional to the pulse-repetition rate and switching speed of the signals, and to the length of the pathway. A major component of this distortion is caused by improper impedance matching. A circuit is said to be perfectly matched when both the source and the load at the opposite ends of the transmission pathway match the characteristic impedance of the pathway. When impedance discontinuities are present, unwanted reflections are created within the transmission pathway. These transmissions degrade the signal by effectively cancelling the transfer of energy from the signal source to the receiving circuit. These reflections arise when a signal encounters a sudden change in characteristic impedance somewhere along a transmission line. Two simple techniques are used to reduce these reflections: shortening the length of the transmission line or spacing the conducting lines more closely to minimize line bends. The disadvantage of the close spacing is that it greatly enhances the problem of crosstalk.

Crosstalk created by fields of radiation is propagated by electrical current flowing through transmission lines and inducing currents in other nearby conductors. Both electrostatic and electromagnetic fields produce unwanted interference in transmission lines.

Introduction of gallium arsenide monolithic technology into the digital-circuit arena creates instances in which microstrip lines are used for carrying pulses rather than microwave energy. Digital pulses are attenuated in transmission lines by shunt capacitance between traces through the dielectric, series resistance of the conductor, and dielectric losses. The resistive losses are aggravated by the skin effect, but vary only as the square root of the frequency. Conventional shielding, which completely encloses a transmission line within a grounded conductor, can reduce a large share of this type of distortion caused by electrical radiation; but extremely high signal frequencies tend to defeat such protective measures. One way to minimize crosstalk is to separate transmission lines by relatively large distances. However, design constraints and countervailing sources of distortion, which would be proportionally increased by larger line separations, militate against using this tactic to reduce the source of noise. Another simple means of reducing crosstalk is to form a helical arrangement of pathways by using two common insulated wires, which are twisted tightly together. Although the added path length brought about by the winding of the conductors adds time delays and other forms of distortion, radiation from each wire in such twisted pair substantially cancels that emitted by the other, and thus cuts down on crosstalk. Twisted-pair transmission lines are not used in subnanosecond applications.

A fixture, described in U.S. Pat. No. 4,672,312 (see also FIG. 1 of the drawings herein), solved the problem for testing of high-speed devices. A fixture, described in U.S. Pat. No. 4,825,155, was tested on a network analyzer with favorable results to 14 GHz.

Experimental test boards of the type disclosed in above-referenced U.S. Pat. No. 4,672,312 were fabricated and tested, and the test results thereof are discussed in the publication by Henry Takamine and Allan Lange, the inventors herein, entitled "Pitfalls in Fabricating Microstrip Test Boards for High-Speed GaAs ICs," *Journal of Monolithic Technologies,* July 1988, pages 22-27. Analysis determined that a major contributor to high discontinuities in the transmission of the signal and excessive voltage standing wave ratio (VSWR) occurred at the transitions from the coaxial connectors to the microstrips, and from other electro-mechanical connections in the test jig, as will become better understood from the following description.

Specifically, as shown in FIG. 1, a gigahertz test jig 10 is girded by a ground wall 12 having insulated openings 14 therein. Coaxial RF connectors 16 having inner conductors or probes 18 and coaxially surrounding shells 20 are secured to ground wall 12, with the shells being in electrical contact therewith. Insulation 22 in openings 14 electrically isolates inner conductors 18 from wall 12. Dielectric layers 24, having signal carrying traces or microstrips 26a and 26b and a ground plane layer 28 thereon, are secured to ground wall 12 by ground rings 30. A conductor 32 extends through dielectric layers 24 and electrically couples ground plane 28 to ground rings 30 and, therefore, to ground wall 12. Another conductor 34, which passes through an insulative sleeve 36 in ground plane layer 28, electrically couples microstrips 26a and 26b together. Both microstrips 26a and 26b are mechanically and electrically coupled to inner conductors 18 of external jig connectors 16 by solder joints 38.

In part, the placement of inner conductor 18 and microstrips 26a and 26b was enforced by a requirement accepted in the industry that microstrip bends be kept to less than a 60° bend to avoid excessive insertion losses and reactive impedances from appearing in the transmission lines, which would otherwise cause large changes in the characteristic impedance. Such changes in the characteristic impedance caused large signal reflections and a resultant excessive signal degradation. While 90° bends are known, they were obtainable only for use up to only UHF frequencies where degradation in signal transmission is not a problem.

The connections between microstrips 26a and 26b and conductors 18 and between ground plane 28 and ground wall 12 produced insertion losses, where the electric signals did not follow the desired paths to as great an extent as would be desired. Solder joints 38 did not provide the best mechanical interface connections respectively between microstrips 26a and 26b. Therefore, inner conductors 18 of connectors 16 not only are indirectly coupled to microstrips 26a and 26b but also are exposed to potentially disturbing external signals. Further, because connector 16 is coupled through ground wall 12 to ground plane 28 by an intermediate conductor 32 and the connection between ground plane 28 and wall 12 is a clamp, rather than by a bond, such as by solder, there is a concern that, under some conditions, the electrical connection might become subject to uncoupling or loosening through variations in temperature, vibrations, corrosion, etc.

However well the assembly functions, future market needs make it desirable that its cost of fabrication be reduced to make it more competitive, that its size be reduced, and that its bandwidth be augmented to enable it to operate in excess of 14 GHz and in the x-band frequencies.

SUMMARY OF THE INVENTION

These and other problems are successfully addressed and overcome by the present invention. In general, each RF coaxial connector is secured at substantially 90° to the circuit board, its outer shell is directly coupled to the ground plane on the circuit board, and its inner conductor is housed within the dielectric of the circuit board and is directly secured to its microstrip with a substantially 90° connection having a smooth transition therebetween. In addition, a tuning element may be placed substantially about the 90° connection, and grounded to lower the VSWR of the line. The tuning element is connected to the ground plane through vias, and can take any shape or form, or be configured as capacitive or inductive stubs. The vias connecting the tuning element to the ground plane also can be any appropriate shape or form. Coaxial connectors are placed wherever needed and are not required to be positioned adjacent the edge of the circuit board. While a 90° connection is preferred to best avoid excessive insertion losses and reactive impedances from appearing in the transmission lines, this right-angled transition may be angularly varied from the normal so long as unacceptable degradation in signal transmission does not occur.

While convention accepted in the industry stated that angles of 60° or less were required, as stated above, it was found that the preferred 90° angular transition could avoid excessive losses and reactive impedances when the 90° connection or transition was made physically smooth.

Several advantages are derived from this arrangement. Controlled impedances, for example of 50 ohms, are obtained throughout the right angle transition of the coaxial connector to the microstrip, while maintaining dielectric, radiation and conductor losses at a minimum. The direct connection between the inner conductor and the microstrip is without a discontinuity. The inner conductor is housed within a dielectric and, therefore, is protected from external, spurious signals. The connector is directly coupled to the ground plane, and may be positioned to minimize the lengths of the signal paths. The assembly is smaller and permits a decrease in size suitable for use in high speed gallium arsenide digital integrated circuit test circuits operating in the x-band frequencies, as well as for millimeter wave integrated circuit test needs. It is easier and less expensive to manufacture than existing gigahertz test jigs. The inventive assembly may be tuned. A VSWR of 1.15 at 15 GHz, and an insertion loss of −0.4 dB at 12 GHz and −0.5 dB at 15 GHz were obtained.

Other aims and advantages, as well as a more complete understanding of the present invention, will appear from the following explanation of exemplary embodiments and the accompanying drawings thereof.

BRIEF DESCRIPTION OF THE DRAWINGS

FIG. 3 is a cross-sectional view of the assembly shown in FIG. 2 taken along line 3—3 thereof;

FIG. 4 depicts a specimen of a circuit board, illustrating a specific arrangement based upon the concepts shown in FIG. 2 and including a plurality of interconnects and microstrips viewed from the top side of the specimen;

FIG. 5 is a view of bottom side, and the interconnects and microstrips thereon, of the specimen shown in FIG. 4;

FIG. 6 is a top view of a connection between a microcomputer and a microstrip, further including a tuning element added to the assembly illustrated in FIGS. 2 and 3 for shielding and focussing of the transmitted signal; and FIG. 7 is a cross-sectional view of the embodiment shown in FIG. 6 taken along line 7—7 thereof.

DETAILED DESCRIPTION OF THE PREFERRED EMBODIMENTS

Figure 1:
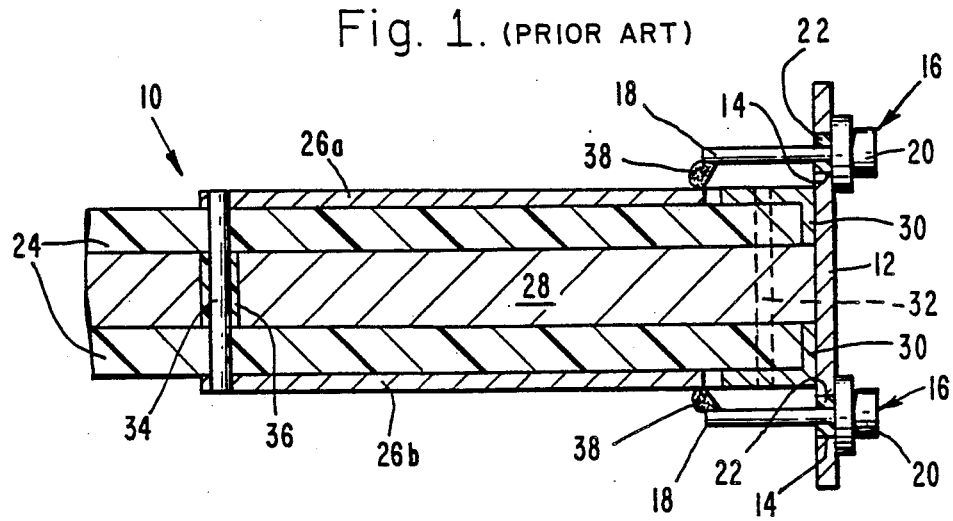
FIG. 1 is a cross-sectional view of a prior art apparatus disclosed in U.S. Pat. No. 4,672,312.

The prior art assembly disclosed in U.S. Pat. No. 4,672,312 and illustrated in FIG. 1 has been described and discussed above.

Figure 2:
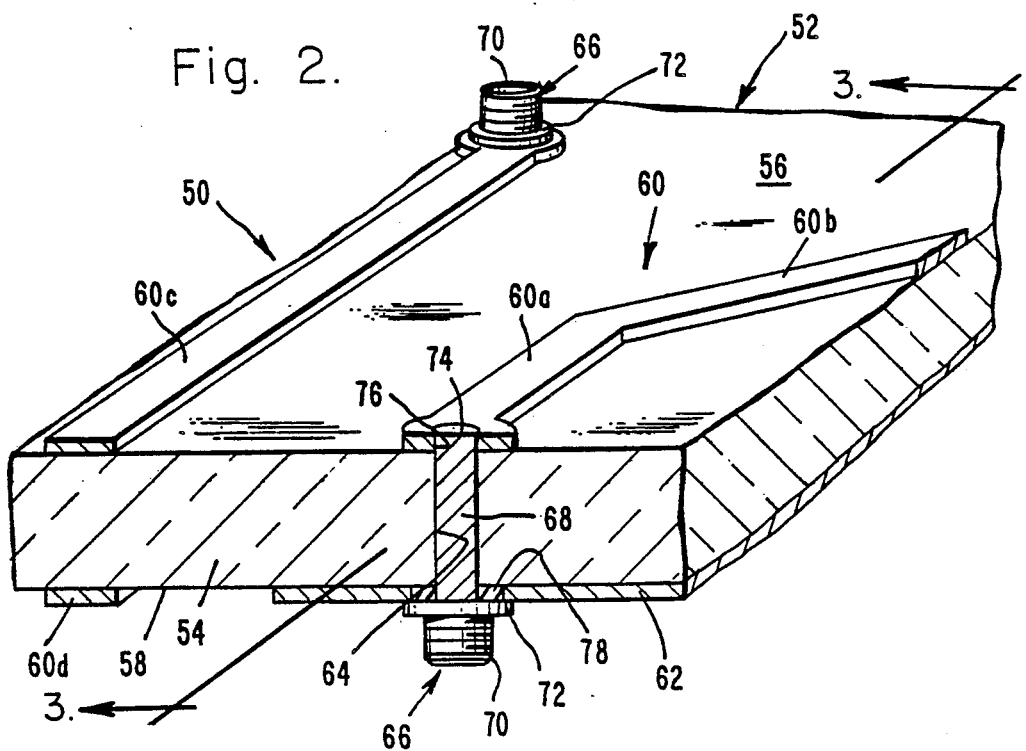
FIG. 2 is a fragmentary view in perspective of a typical arrangement of the present invention comprising an assembly of two interconnects and microstrips extending from opposite sides of a circuit board.

Referring to FIGS. 2 and 3, a portion 50 of a typically arranged gigahertz test jig, which is fashioned in accordance with the teachings of the present invention, includes a circuit board 52 comprising a core 54 of dielectric material and conductive cladding on its top and bottom surfaces 56 and 58 respectively. The conductive cladding is processed into microstrips or traces and ground planes by conventional masking and etching techniques. As shown, a microstrip 60 comprises a straight portion 60a and a portion 60b angled thereto. A ground plane 62 is positioned only on one surface 58, with a pair of oppositely placed traces 60c and 60d respectively on surfaces 56 and 58. Holes, such as hole 64 extend through the circuit board and ground planes 62, to microstrips 60.

Single RF coaxial connectors 66 are secured 90° to surfaces 56 and 58 of circuit board 52. As stated above, while a 90° connection is preferred to best avoid excessive insertion losses and reactive impedances from appearing in the transmission lines, this right-angled transition may be angularly varied from the normal so long as unacceptable degradation in signal transmission does not occur. Each connector 66 includes a probe or inner conductor 68 and a conductive shell 70 bounded by a conductive collar 72. Inner conductor 68 extends through hole 64 from one circuit board surface to the other, and end 74 of conductor 68 passes through a hole 76 in microstrip 60. End 74 is soldered or otherwise mechanically and electrically secured to the microstrip. All solder bumps formed by the soldering of conductor ends 74 to microstrips 60 are smoothed, such as by sanding, to provide a relatively flush connection between ends 74 and microstrips 60 and, thus, to form a smooth transition between the conductor and the micro-strip. This smoothing eliminates the otherwise high mismatch and VSWR therebetween. Variations from this smooth or flush connection are dependent upon the mismatch and VSWR that can be tolerated. In general, the thickness and height of the microstrip determine the degree of smoothness or flushness to be permitted.

In FIGS. 2 and 3, a washer 78 of insulative material is positioned between inner conductor 68 and ground plane 62 to electrically insulate one from the other. Collar 72 and the portion of ground plane 62 contact one another to form a mutually intimate electrical contact, and the two are soldered together about the entire periphery of collar 72.

FIG. 3, which has been discussed above along with FIG. 2, is a cross-sectional view of the assembly shown in FIG. 2, taken along line 3—3 thereof. The same reference numerals are used for the same structural elements in FIG. 3 as in FIG. 2.

As shown in FIGS. 4 and 5, a specimen 50' of a circuit board 52' includes microstrips or traces 60' which are surrounded by ground planes 62' or segments thereof to provide tuning at the smooth transition connection between an inner conductor end, such as end 74, and microstrip 60'. Such tuning focuses the signal back into the microstrip, shields the traces from external or spurious signals and helps to eliminate crosstalk between adjacent traces.

FIGS. 6 and 7 illustrate an alternate tuning arrangement comprising a tuning element trace 80 which is electrically connected to ground plane 62 through a via construction 82 (see FIG. 7) of one or more vias. Although shown as having a rectangular configuration in FIG. 6, tuning element 80 can take any shape or form, e.g., continuous or segmented and rectangular, angled or curved. It is only necessary that the shape or form capacitively or inductively match that of microstrip 60. The vias in construction 82 (see FIG. 7) are electrically insulated from inner conductor 68 by insulative material 84 (see FIG. 7), which may comprise an extension of washer 78 shown in FIG. 2 or be appropriately shaped and formed to properly ground trace 80.

In either case, tuning is used to obtain a VSWR minimum, which occurs when two reflections are out of phase. This relationship is used to create a low VSWR in the 90° bend which has an unavoidable impedance discontinuity, invariably caused by the transitions between the coaxial connector to the microstrip. By placing a second, out-of-phase discontinuity near the transition and at proper distance therefrom, the total VSWR was made very low. This technique is most effective over a narrow bandwidth, because the phase relationship between the two discontinuities changes when the frequency is changed. Thus, tuning element 80 is configured to obtain an overall best VSWR throughout the bandwidth of interest. Because all the traces on a given test fixture are dimensionally symmetrical, only a single tuning element need be mathematically derived and electrically tuned on a network analyzer for final configuration. All remaining tuning elements are etched simultaneously and are identically configured as the tuned and tested element.

Although the invention has been described with respect to particular embodiments thereof, it should be realized that various changes and modifications may be made therein without departing from the spirit and scope of the invention.

What is claimed is:

1. A method for minimizing mismatch and voltage standing wave ratio (VSWR) in a plurality of connections between a plurality of microstrips on a circuit board and a corresponding plurality of conductors extending through holes in the circuit board and for providing a bandwidth sufficient to enable the circuit board to operate in excess of 14 GHz and in x-band frequencies comprising the steps of:

placing each said conductor in said hole in a position relative to each said microstrip to provide an angular transition at each connection for militating against deleterious degradation in signal transmission therethrough resulting from excessive insertion losses and reactive impedances therein;

altering each connection at each transition to provide sufficient physical flushness and smoothness for obtaining a desired low level of the mismatch and voltage standing wave ratio in the connection;

providing a plurality of a conductive tuning material substantially surrounding and electrically insulated from each said connection between each said microstrip and each said corresponding conductor, said tuning material having a size and shape that inductively matches that of the microstrip and having an out-of-phase discontinuity with respect to that of the microstrip;

placing a first one of the conductive tuning material near a first transition and at a selected distance therefrom sufficient for obtaining the desired low level of the mismatch and an overall best voltage standing wave ratio in the connection; and placing the remaining ones of the conductive tuning material relative to the remaining ones of the transitions in a position identical to said first one of the conductive tuning material relative to said first transition.

2. A controlled impedance interconnection assembly having a bandwidth sufficient for enabling it to operate in excess of 14 GHz and in x-band frequencies, for connecting an x-band coaxial micro-connector to a microstrip on a circuit board, comprising:

a circuit board having
      a core of dielectric material terminated by first and second surfaces,
      an electrically conductive microstrip adhered to said first surface,
      electrically conductive grounded material adhered to said second surface; and
      means defining a hole in said circuit board disposed substantially at right angles to said surfaces, said hole means extending through said core from said conductive material on said second surface to said conductive microstrip on said first surface;

an x-band coaxial connector including an inner conductor and a conductive shell coaxially surrounding said inner conductor, said conductive shell electrically connected to said conductive material, and said inner conductor extending through said hole means and having essentially a right angled mechanical and electrical connection to said conductive microstrip, said connection including an essentially flush transition from said inner conductor to said microstrip sufficient for minimizing undesirable mismatches and voltage standing wave ratio (VSWR) therein and for enabling the circuit board to operate in excess of 14 GHz and in x-band frequencies;

conductive tuning material comprising an etched microstrip element on said first surface substantially surrounding and electrically insulated from said connection between said inner conductor and said microstrip, said tuning material having a size and shape which inductively matches that of said microstrip; and means for electrically coupling said tuning material to said conductive material on said second surface.

3. An assembly according to claim 2 in which said coupling means comprises via means electrically insulated from said inner conductor and extending from said tuning element through said core and into electrical contact with said conductive material on said second surface.

4. An assembly according to claim 2 further including an electrically conductive collar connected to said shell and electrically secured in intimate contact with said conductive material on said second surface.

5. A method for minimizing mismatch and voltage standing wave ratio (VSWR) in a connection between a microstrip on a circuit board and a conductor extending through a hole in the circuit board and for providing a bandwidth sufficient to enable the circuit board to operate in excess of 14 GHz and in x-band frequencies comprising the steps of:

placing said conductor in said hole in a position relative to said microstrip to provide an angular transition at the connection for militating against deleterious degradation in signal transmission therethrough resulting from excessive insertion losses and reactive impedances therein;

altering the connection at the transition to provide sufficient physical flushness and smoothness for obtaining a desired low level of the mismatch and voltage standing wave ratio in the connection and for enabling the circuit board to operate in excess of 14 GHz and in x-band frequencies; and providing conductive tuning material substantially surrounding and electrically insulated from said connection between said conductor and said microstrip, said tuning material having a size and shape that inductively matches that of the microstrip.

6. A method according to claim 5 wherein:
said conductive tuning material has an out-of-phase discontinuity with respect to that of the microstrip; and
the conductive tuning material is placed near the transition and at a selected distance therefrom sufficient for obtaining the desired low level of the mismatch and voltage standing wave ratio in the connection and for enabling the circuit board to operate in excess of 14 GHz and in x-band frequencies.

7. A method according to claim 5 in which said angular transition providing step comprises the step of placing the conductor essentially normal to the microstrip at the connection.

8. A controlled impedance interconnection assembly having a bandwidth sufficient to enable it to operate in excess of 14 GHz and in x-band frequencies, for connecting an x-band connector to a microstrip on a circuit board, comprising:

a circuit board having a core of dielectric material terminated by first and second surfaces, an electrically conductive microstrip on said first surface, and means defining a hole which is disposed substantially at right angles to said surfaces and which extends from said second surface through said core to said conductive microstrip;

a connector including a conductor extending through said hole means and having an angled mechanical and electrical connection to said microstrip, the angle and smoothness of said connection providing a flush transition from said conductor to said microstrip which avoids deleterious degradation in signal transmission through said connection resulting from excessive insertion losses and reactive impedances therein and which enables the circuit board to operate in excess of 14 GHz and in x-band frequencies;

etched microstrip means comprising conductive tuning material on said first surface substantially surrounding and electrically insulated from said connection between said conductor and said microstrip, said tuning material having a size and shape which inductively matches that of said microstrip; and means electrically coupled between said tuning material and said conductive microstrip for grounding said tuning material.

9. An assembly according to claim 8 in which said conductor and said microstrip are physically matched for providing a matched impedance therebetween.

* * * * *